US012084786B2

(12) United States Patent
Phillips et al.

(10) Patent No.: US 12,084,786 B2
(45) Date of Patent: *Sep. 10, 2024

(54) METHODS FOR FORMING A UNITIZED CRUCIBLE ASSEMBLY

(71) Applicant: GlobalWafers Co., Ltd., Hsinchu (TW)

(72) Inventors: Richard Joseph Phillips, St. Peters, MO (US); Salvador Zepeda, St. Peters, MO (US); Patrick Fredrick Boegemann, III, St. Peters, MO (US); William Luter, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,348

(22) Filed: Jan. 7, 2022

(65) Prior Publication Data
US 2022/0127748 A1    Apr. 28, 2022

Related U.S. Application Data

(63) Continuation of application No. 16/796,482, filed on Feb. 20, 2020, now Pat. No. 11,377,751, and a
(Continued)

(51) Int. Cl.
C30B 15/00  (2006.01)
B22C 9/00   (2006.01)
(Continued)

(52) U.S. Cl.
CPC ............... C30B 15/10 (2013.01); B22C 9/00 (2013.01); B28B 1/261 (2013.01); B28B 7/16 (2013.01);
(Continued)

(58) Field of Classification Search
CPC .............. C30B 15/10; B22C 9/00; B28B 7/16
See application file for complete search history.

(56) References Cited

U.S. PATENT DOCUMENTS 1,909,008 A   5/1933  Prange et al.
2,795,022 A   6/1957  Shaw et al.
(Continued)

FOREIGN PATENT DOCUMENTS

CN   102001819 A    4/2011
DE       233503    *  3/1986
(Continued)

OTHER PUBLICATIONS

F.R.R Mallory (How to Make Plaster of Paris Molds, 2010, hereinafter Mallory) (Year: 2010).*
(Continued)

Primary Examiner — Seyed Masoud Malekzadeh
Assistant Examiner — Andres E. Behrens, Jr.
(74) Attorney, Agent, or Firm — Armstrong Teasdale LLP

(57) ABSTRACT

Methods for forming a unitized crucible assembly for holding a melt of silicon for forming a silicon ingot are disclosed. In some embodiments, the methods involve a porous crucible mold having a channel network with a bottom channel, an outer sidewall channel that extends from the bottom channel, and a central weir channel that extends from the bottom channel. A slip slurry may be added to the channel network and the liquid carrier of the slip slurry may be drawn into the mold. The resulting green body may be sintered to form the crucible assembly.

12 Claims, 9 Drawing Sheets

Related U.S. Application Data continuation of application No. 16/796,522, filed on Feb. 20, 2020, now Pat. No. 11,326,271.

(51) Int. Cl.

| | |
|---|---|
| *B28B 1/00* | (2006.01) |
| *B28B 1/26* | (2006.01) |
| *B28B 7/00* | (2006.01) |
| *B28B 7/16* | (2006.01) |
| *C04B 35/00* | (2006.01) |
| *C04B 38/00* | (2006.01) |
| *C30B 15/10* | (2006.01) |
| *C30B 15/12* | (2006.01) |
| *C30B 29/06* | (2006.01) |
| *C30B 35/00* | (2006.01) |

(52) U.S. Cl.
CPC ............ *C04B 38/00* (2013.01); *C30B 15/002* (2013.01); *C30B 15/12* (2013.01); *C30B 29/06* (2013.01); *C30B 35/002* (2013.01); *C04B 2235/3418* (2013.01); *C04B 2235/6027* (2013.01); *C04B 2235/606* (2013.01); *C04B 2235/656* (2013.01)

(56) References Cited

U.S. PATENT DOCUMENTS

| | | | |
|---|---|---|---|
| 3,172,176 A | 3/1965 | Greenwood et al. | |
| 3,423,216 A | 1/1969 | Somers et al. | |
| 3,435,885 A * | 4/1969 | Grosjean | B22D 27/15 |
| | | | 164/385 |
| 3,608,617 A * | 9/1971 | Burke | B22C 9/00 |
| | | | 164/133 |
| 4,072,489 A | 2/1978 | Loxley et al. | |
| 4,789,389 A | 12/1988 | Schermerhorn et al. | |
| 5,053,359 A | 10/1991 | Loxley et al. | |
| 6,344,160 B1 * | 2/2002 | Holtzberg | B29C 67/241 |
| | | | 264/102 |
| 8,262,797 B1 | 9/2012 | Bender et al. | |
| 8,524,319 B2 | 9/2013 | Kimbel et al. | |
| 9,133,063 B2 | 9/2015 | Sudo et al. | |
| 10,450,670 B2 | 10/2019 | Swaminathan et al. | |
| 11,111,597 B2 * | 9/2021 | Hudson | C30B 15/203 |
| 11,326,271 B2 * | 5/2022 | Phillips | C30B 29/06 |
| 11,767,610 B2 * | 9/2023 | Pannocchia | C30B 15/002 |
| | | | 117/15 |
| 2004/0102308 A1 * | 5/2004 | Simpson | C04B 35/486 |
| | | | 428/34.4 |
| 2007/0082149 A1 | 4/2007 | Linnot et al. | |
| 2008/0153688 A1 | 6/2008 | Kawaguchi et al. | |
| 2010/0226747 A1 | 9/2010 | Sato et al. | |
| 2011/0180229 A1 | 7/2011 | Phillips et al. | |
| 2012/0160155 A1 | 6/2012 | Sudo et al. | |
| 2012/0208690 A1 | 8/2012 | Cortellini et al. | |
| 2014/0144372 A1 | 5/2014 | Swaminathan | |
| 2014/0174337 A1 | 6/2014 | Swaminathan | |
| 2014/0261154 A1 * | 9/2014 | Swaminathan | C30B 15/002 |
| | | | 117/213 |
| 2014/0261155 A1 * | 9/2014 | Kimbel | C30B 15/14 |
| | | | 117/213 |
| 2015/0144056 A1 * | 5/2015 | Swaminathan | C30B 15/12 |
| | | | 117/213 |
| 2016/0017513 A1 | 1/2016 | Haringer et al. | |
| 2016/0024685 A1 | 1/2016 | Swaminathan | |
| 2017/0022631 A1 * | 1/2017 | Phillips | C30B 15/14 |
| 2017/0356099 A1 * | 12/2017 | Chen | C30B 15/04 |
| 2018/0044815 A1 * | 2/2018 | Swaminathan | C30B 29/06 |
| 2018/0187329 A1 * | 7/2018 | Zepeda | C30B 15/02 |
| 2018/0291524 A1 * | 10/2018 | Basak | C30B 15/04 |
| 2019/0078231 A1 * | 3/2019 | Mehdizadeh Dehkordi | |
| | | | C30B 35/002 |
| 2019/0203377 A1 | 7/2019 | Mehdizadeh Dehkordi et al. | |

FOREIGN PATENT DOCUMENTS

| | | | | |
|---|---|---|---|---|
| DE | 102018106725 A1 | * | 9/2019 | |
| JP | H03080182 A | | 4/1991 | |
| JP | 2010280529 | * | 6/2009 | ............... B22C 1/00 |
| JP | 2010138034 A | | 6/2010 | |
| JP | 2010280529 A | | 12/2010 | |
| JP | 2010280567 A | | 12/2010 | |
| JP | 2002003228 A | | 1/2022 | |
| WO | 2005016837 A1 | | 2/2005 | |
| WO | 2014152852 A2 | | 9/2014 | |
| WO | 2017087817 A1 | | 5/2017 | |
| WO | WO-2021015074 A1 | * | 1/2021 | |

OTHER PUBLICATIONS

JP-2010280529 (Tadashi) Jun. 2010 (online machine translation), [Retrieved on Aug. 6, 2023]. Retrieved from: Espacenet (Year: 2010).*

DD-233503 (Lange) Mar. 1986 (online machine translation), [Retrieved on Oct. 24, 2023]. Retrieved from: Espacenet (Year: 1986) (Year: 1986).*

WO-2021015074-A1 (Toru ) Jan. 2021 (online machine translation), [Retrieved on Oct. 24, 2023]. Retrieved from: Espacenet (Year: 2021).*

DE-102018106725 (Homa) Sep. 2019 (online machine translation), [Retrieved on Oct. 24, 2023]. Retrieved from: Espacenet (Year: 2019).*

Mallory, F.R.R. "How to Make Plaster of Paris Molds." EHow, Leaf Group, https://www.ehow.com/how_5188651_make-plaster-paris-molds.html. (2010), 19 pages.

F.R.R. Mallory, "How to Make Plaster Handprints of Your Child." EHow, Leaf Group, https://web.archive.org/web/20160316073341/https://www.ehow.com/how_5188651_make-plaster-paris-molds.html. (Year: 2016), 4 pages.

McPartlan, Mimi, "Emphasizing vol. with Double-Walled Forms,", Default, https://ceramicartsnetwork.org/ceramics-monthly/ceramics-monthly-article/Emphasizing-Volume-with-Double-Walled-Forms-132746#, May 2016, 26 pages.

"Making Clay and Grog Crucibles for Melting Metal", YouTube, uploaded by Jimmy Cogg, Oct. 12, 2018, www.youtube.com/watch?v=s6ZmDY5Vma8. (Year: 2018).

\* cited by examiner

METHODS FOR FORMING A UNITIZED CRUCIBLE ASSEMBLY

CROSS-REFERENCE TO RELATED APPLICATIONS

This application is a continuation of U.S. Non-provisional patent application Ser. No. 16/796,522, filed Feb. 20, 2020 and is a continuation of U.S. Non-provisional patent application Ser. No. 16/796,482, filed Feb. 20, 2020. Both applications are incorporated herein by reference in their entirety.

FIELD OF THE DISCLOSURE

The field of the disclosure relates to methods for forming a unitized crucible assembly for holding a melt of silicon for forming a silicon ingot and, in particular, methods for forming a unitized crucible assembly having central and inner weirs for use in continuous Czochralski silicon ingot growth. The field of the disclosure also relates to crucible molds and unitized crucibles.

BACKGROUND

Single crystal silicon ingots may be prepared by the so-called Czochralski method in which a single crystal silicon seed is contacted with a silicon melt held within a crucible. The single crystal silicon seed is withdrawn from the melt to pull the single crystal silicon ingot from the melt. The ingot may be prepared in a batch system in which a charge of polycrystalline silicon is initially melted within the crucible and the silicon ingot is withdrawn from the melt until the melted silicon within the crucible is depleted. Alternatively, the ingot may be withdrawn in a continuous Czochralski method in which polysilicon is intermittently or continuously added to the melt to replenish the silicon melt during ingot growth.

In a continuous Czochralski method, the crucible may be divided into separate melt zones. For example, the crucible assembly may include an outer melt zone in which polycrystalline silicon is added and melted to replenish the silicon melt as the silicon ingot grows. The silicon melt flows from the outer melt zone to a stabilization zone within the outer melt zone in which the melt thermally stabilizes. The silicon melt then flows from the stabilization zone to a growth zone from which the silicon ingot is pulled.

Conventionally, crucible assemblies for growing silicon ingots by a continuous Czochralski method may include one or more nested crucibles such as the crucible assembly shown in U.S. Pat. No. 10,450,670. Alternatively or in addition, the crucible assembly may include one or more weirs that are connected to and extend upward from the bottom of the crucible as disclosed in U.S. Pat. No. 8,262,797. Both types of crucible arrangements involve use of alignment tools when placed into the crystal puller hot zone to provide uniform gas flow over the crucible assembly. Both types of constructions require a connection be formed at the bottom of the crucible assembly (i.e., boding of weirs or crucibles to the bottom of the assembly). These connections may degrade which causes the crucible assembly to deform and lose one or more tolerances.

A need exists for crucible assemblies that resist deformation, that may be placed in the hot zone without or with less alignment tools, and which may be more simply fabricated, and for methods for preparing such crucible assemblies.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

An aspect of the present disclosure is directed to a method for forming a unitized crucible assembly for holding a melt of silicon for forming a silicon ingot by the Czochralski method. A crucible mold is provided. The mold has a channel network that includes a bottom channel and an outer sidewall channel that extends from the bottom channel. The channel network also includes a central weir channel that extends from the bottom channel and an inner weir channel that extends from the bottom channel. The central weir channel is disposed between the outer sidewall channel and the inner weir channel. A slip slurry is introduced into the channel network to fill the bottom channel, outer sidewall channel, central weir channel, and inner weir channel with the slip slurry. The slip slurry includes silica and a liquid carrier. The liquid carrier is at least partially removed from the channel network to form a green body. The green body is removed from the crucible mold. The green body is sintered to dry and densify the green body to form the unitized crucible assembly.

Another aspect of the present disclosure is directed to a method for forming a unitized crucible assembly for holding a melt of silicon for forming a silicon ingot by the Czochralski method. A crucible mold is provided. The mold includes a porous body and a channel network disposed within the porous body. The channel network includes a bottom channel, an outer sidewall channel that extends from the bottom channel, and an inner weir channel that extends from the bottom channel. The inner weir channel is disposed interior to the outer sidewall channel. A slip slurry is introduced into the channel network to fill the bottom channel, outer sidewall channel and inner weir channel with the slip slurry. The slip slurry includes silica and a liquid carrier. The liquid carrier is at least partially drawn into the mold by capillary action to form a green body. The green body is separated from the crucible mold. The green body is sintered to dry and densify the green body to form the unitized crucible assembly.

Yet another aspect of the present disclosure is directed to a crucible mold. The crucible mold includes a lower portion and an upper portion disposed above the lower portion. The upper portion forms a central weir channel and an inner weir channel. The upper portion and lower portion together form a bottom channel and a sidewall channel fluidly connected to the bottom channel. The central weir channel and inner weir channel extend from the bottom channel.

Yet a further aspect of the present disclosure is directed to a crucible assembly. The crucible assembly includes a bottom, an outer sidewall that extends upward from the bottom, a central weir that extends upward from the bottom and an inner weir that extends upward from the bottom. The central weir is disposed between the outer sidewall and the inner weir. The bottom, outer sidewall, central weir and inner weir are unitized and are free of seams at (1) a joint between the outer sidewall and the bottom, (2) a joint between the central weir and the bottom, (3) a joint between the inner weir and the bottom.

Various refinements exist of the features noted in relation to the above-mentioned aspects of the present disclosure.

Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
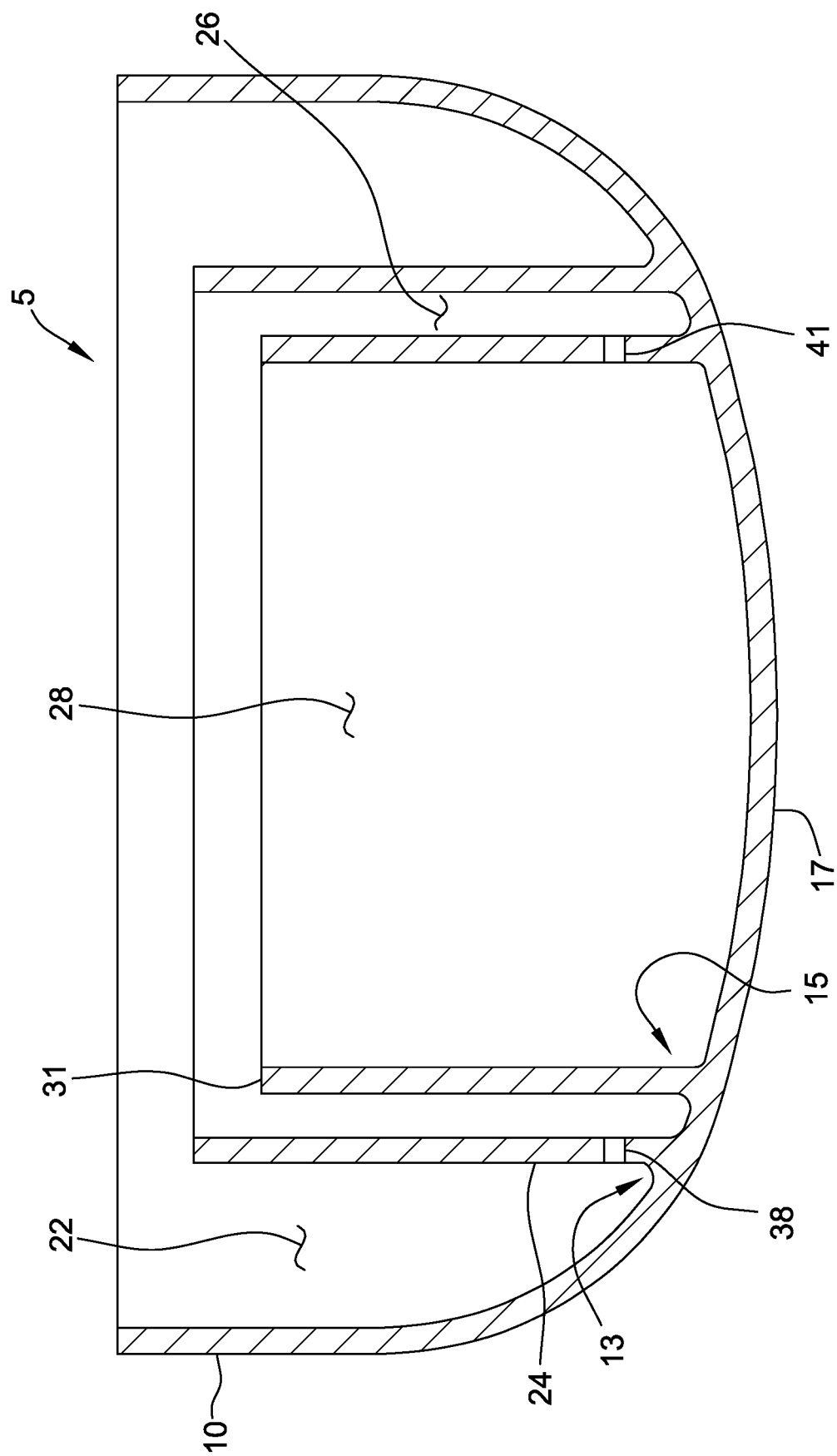
FIG. 1 is a cross-section of an embodiment of a unitized crucible assembly.

Provisions of the present disclosure relate to methods for forming a unitized crucible (e.g., one-piece construction) for holding a melt of silicon for forming a silicon ingot by the Czochralski method. An example unitized crucible assembly 5 that may be produced by embodiments of the present disclosure is shown in FIG. 1. The unitized crucible assembly 5 includes a bottom 17 and an outer sidewall 10 that extends upward from the bottom 17. The crucible assembly 5 includes a central weir 24 and an inner weir 31 that both extend upward from the bottom 17. The central weir 24 is disposed between the outer sidewall 10 and the inner weir 31.

In accordance with embodiments of the present disclosure, a crucible mold 8 (FIG. 2) having a channel network 20 (FIGS. 5-6) formed therein is provided. The mold 8 includes an upper portion 12 and a lower portion 18 which, when assembled together, form the channel network 20. As described further below, a slip is poured into the channel network 20 and a "green body" 40 (FIG. 2) in the shape of the crucible is formed. The green body 40 is removed from the mold 8 and is sintered to form the unitized crucible assembly 5 (FIG. 1).

Figure 2:
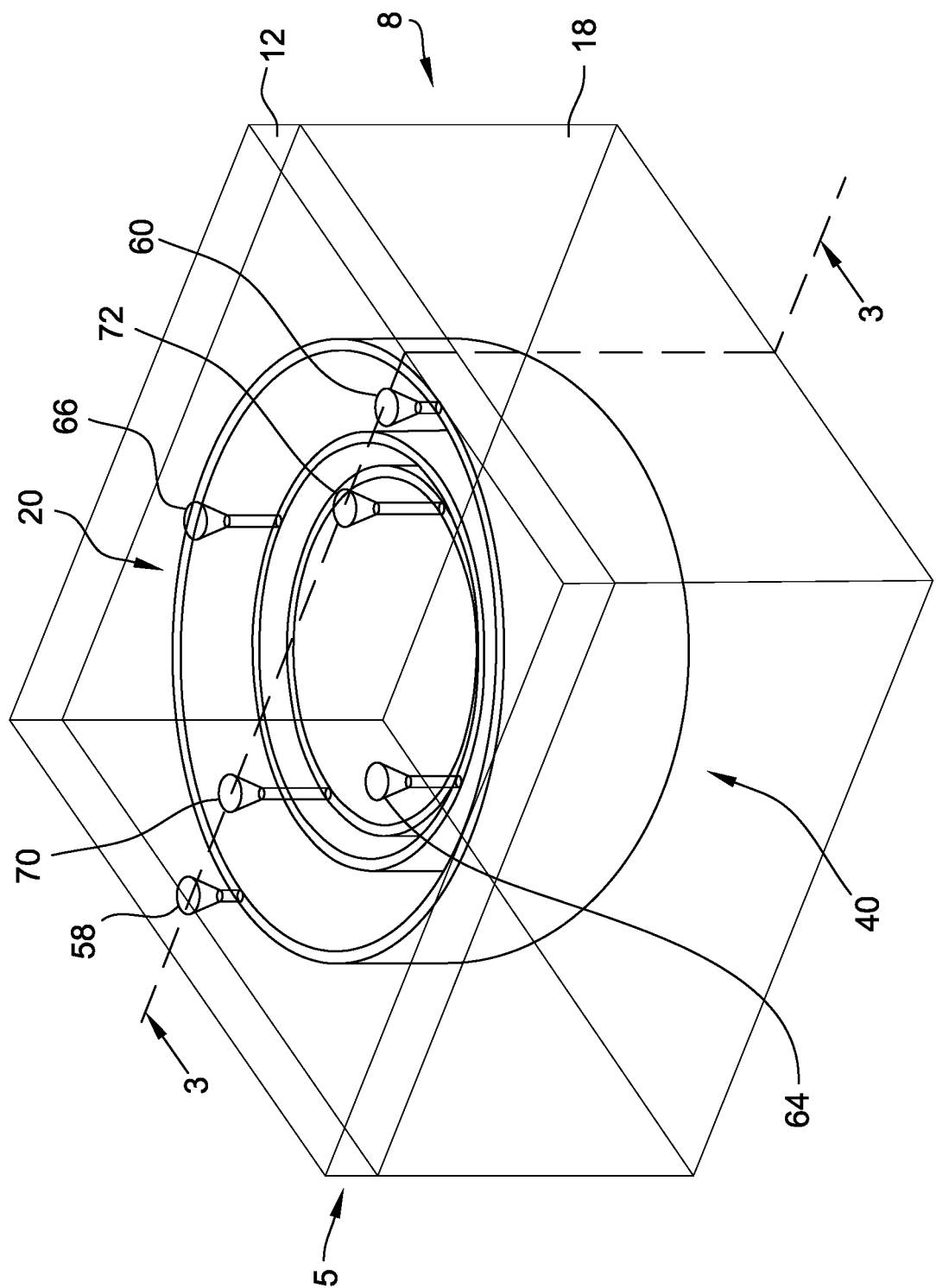
FIG. 2 is a perspective view of an embodiment of a crucible mold having a green body formed therein.
Figure 3:
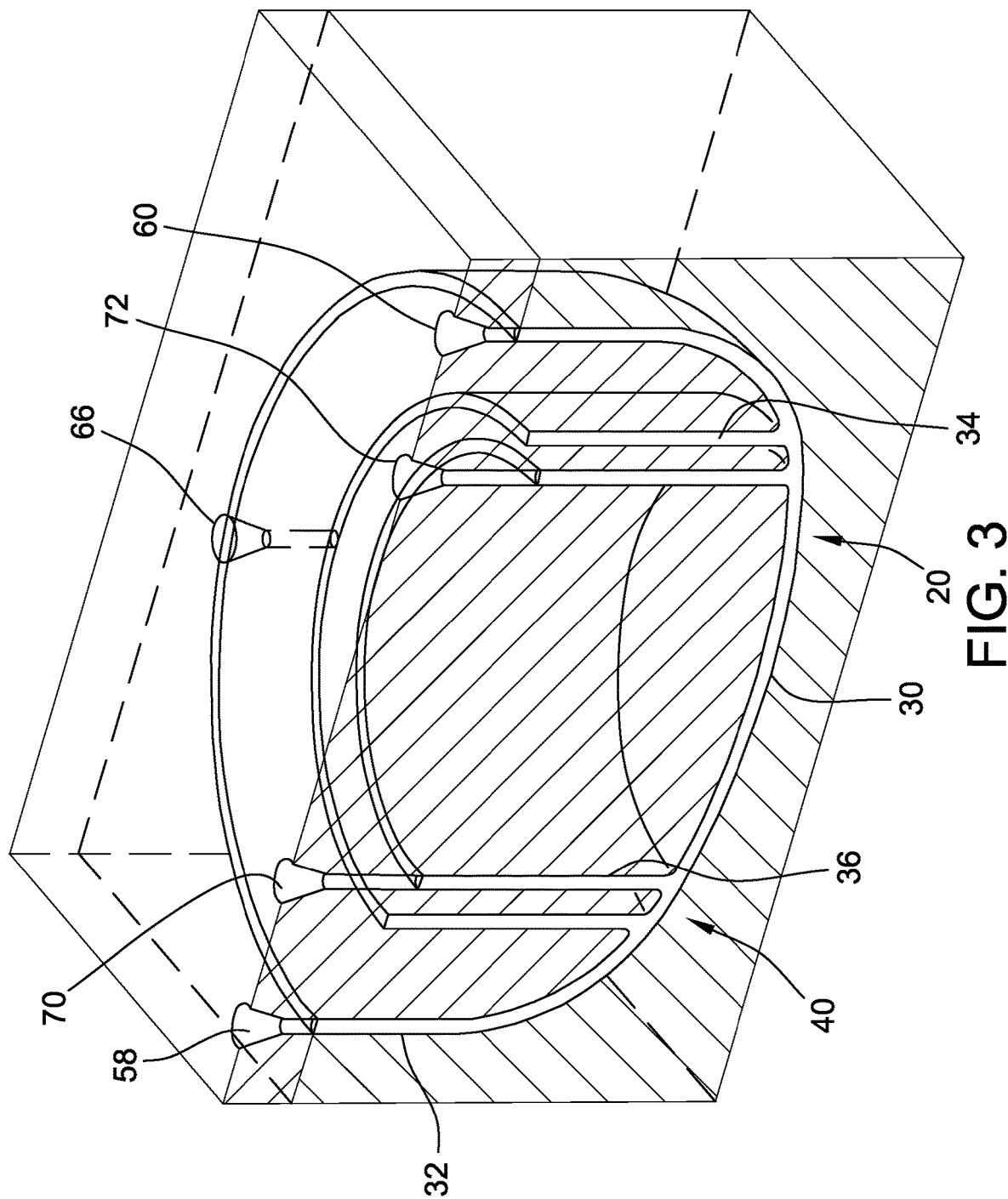
FIG. 3 is a perspective cross-section view of the crucible mold and green body taken along line 3-3 in FIG. 2.
Figure 4:
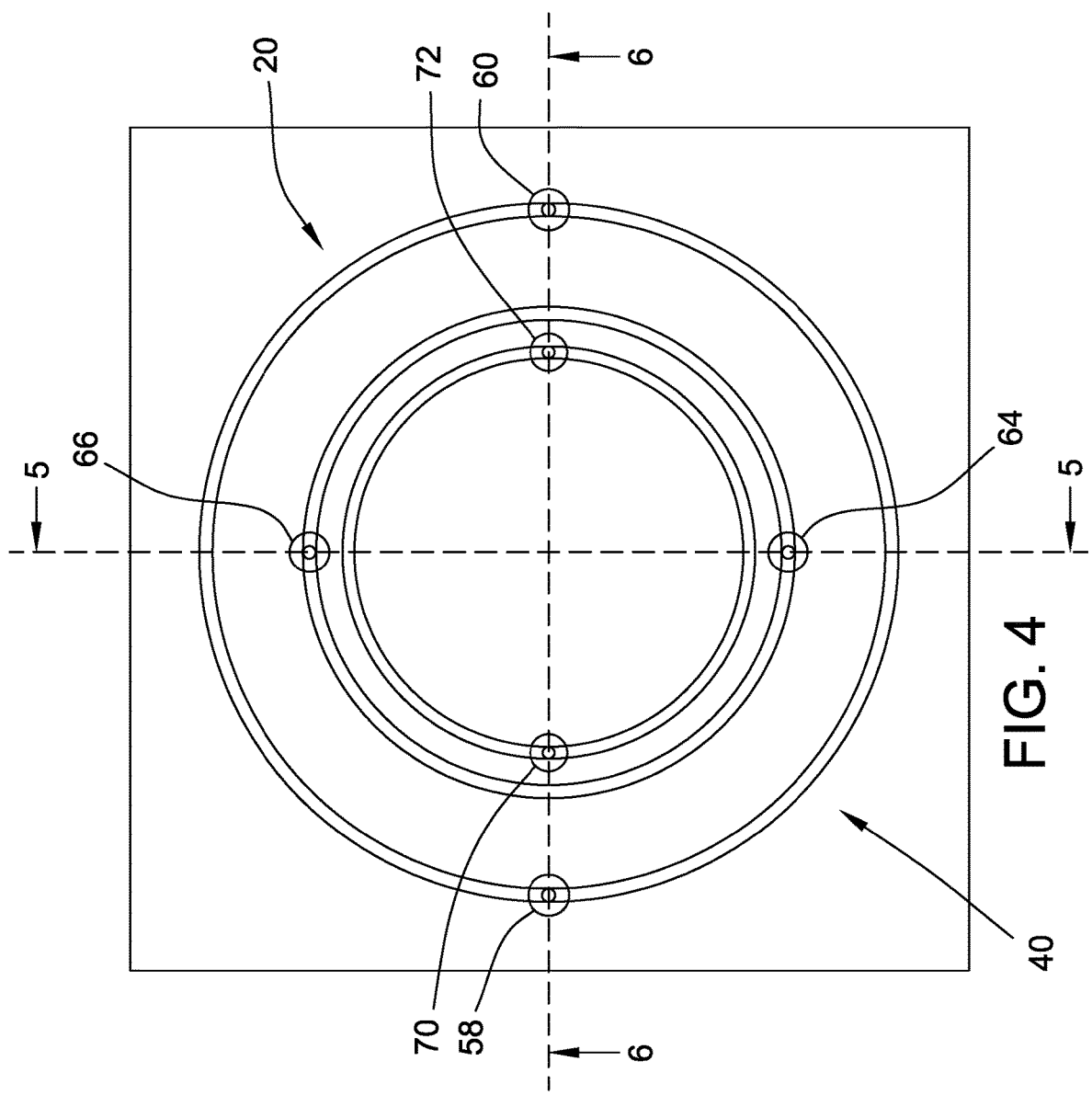
FIG. 4 is a top view of the crucible mold and green body.

Referring now to FIGS. 2-4 in which the mold 8 is transparent for illustration and the channel network 20 is shown with a green body 40 formed therein, the channel network 20 includes a bottom channel 30 and an outer sidewall channel 32. The channel network 20 also includes a central weir channel 34 and an inner weir channel 36 that are each disposed inward of the outer sidewall channel 32. The central weir channel 34 is disposed between inner weir channel 36 and the outer sidewall channel 32. As shown in FIG. 3, the outer sidewall channel 32, central weir channel 34 and the inner weir channel 36 are fluidly connected to the bottom channel 30 (i.e., each of the channels of the channel network are fluidly connected which allow the resulting crucible to be unitized).

The upper portion 12 of the mold 8 includes a main body 49 (FIGS. 5-6) and a flange 54 that extends radially outward from the main body 49. The main body 49 has a lower surface 53 (i.e., the surface below the flange 54 that forms a surface of the bottom channel 30 and the outer sidewall channel 32).

The lower portion 18 of the mold 8 also includes a main body 56. The main body 56 has an upper surface 59 (i.e., the surfaces that form a surface of the bottom channel 30 and the outer sidewall channel 32) and forms a recess 61 inward of the upper surface 59. In the illustrated embodiment, at least a portion of the lower surface 53 of the main body 49 of the upper portion 12 of the mold 8 and at least a portion of the upper surface 59 of the lower portion 18 of the mold 8 are rounded to form a rounded crucible bottom 17 (FIG. 1). To assemble the mold 8, the main body 49 of the upper portion 12 is lowered into the recess 61 of the lower portion 18 until the flange 54 rests on the lower portion 18. In this position, the upper and lower portions 12, 18 of the mold 8 together form the bottom channel 30 and the outer sidewall channel 32.

Figure 5:
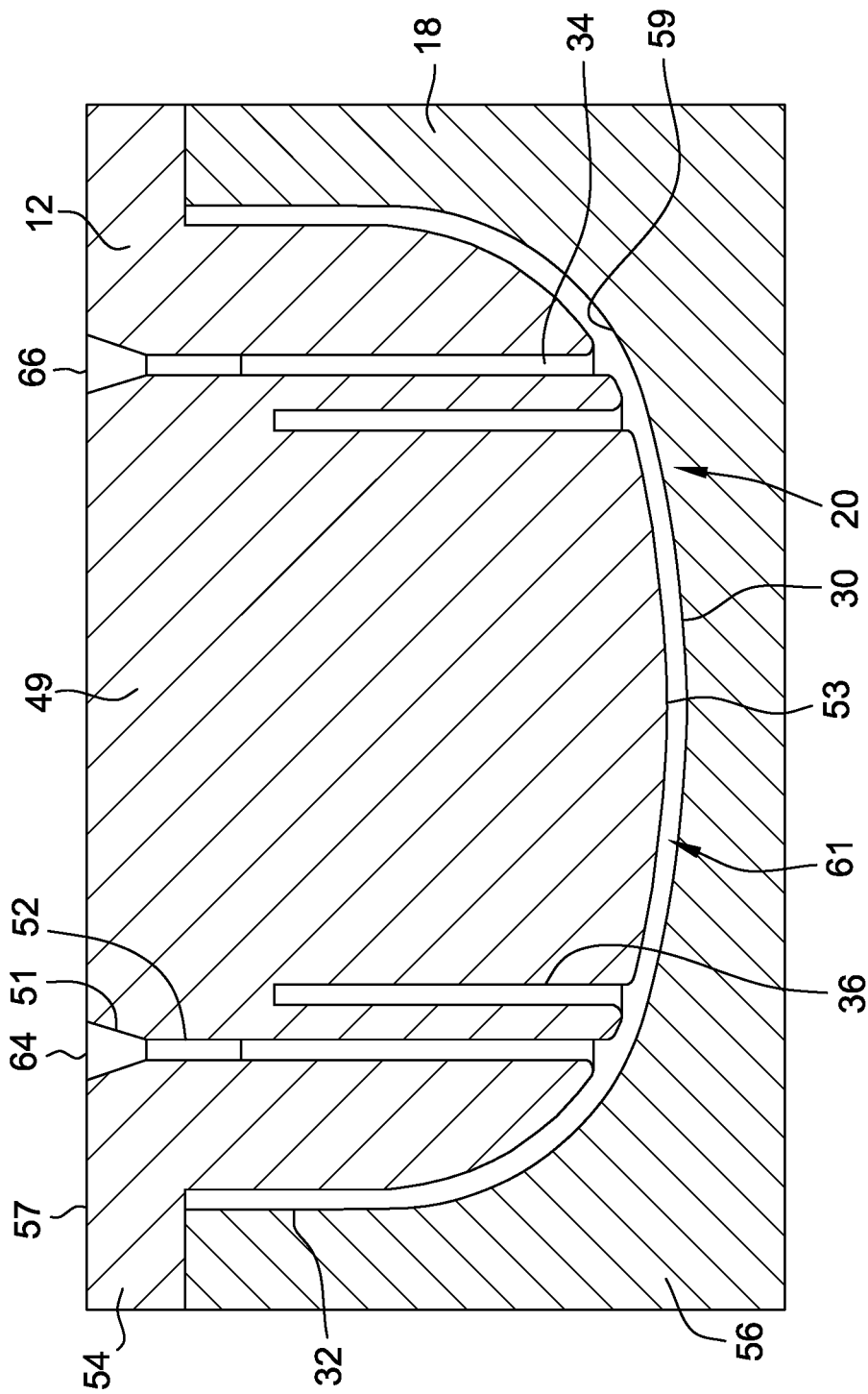
FIG. 5 is a cross-section view of the crucible mold without the green body taken along line 5-5 in FIG. 4.
Figure 6:
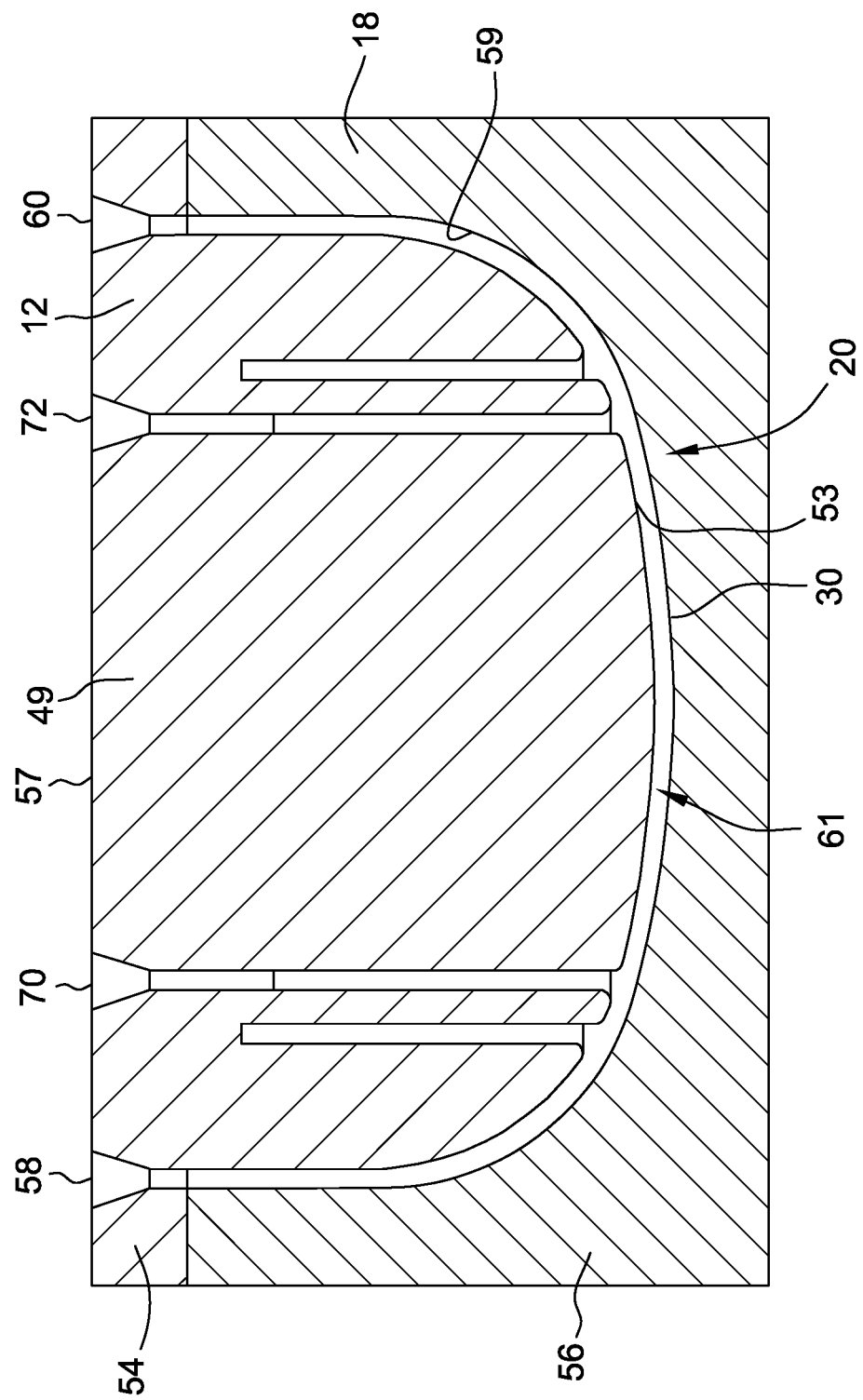
FIG. 6 is another cross-section view of the crucible mold without the green body taken along line 6-6 in FIG. 4.

In the illustrated embodiment, the bottom channel 30 is rounded (and the resulting crucible bottom 17 (FIG. 1) is rounded). In other embodiments, the bottom channel 30 may be more or fully horizontal (i.e., flat) or may be conical or inverted (e.g., having a pedestal in the middle). As shown in FIGS. 5-6, a portion of the sidewall channel 32 is higher than the central weir channel 34 and a portion of the central weir channel 34 is higher than the inner weir channel 36. In other embodiments, the channels may have different relative heights (e.g., the same height of sidewall channel 32, central weir channel 34 and inner weir channel 36).

Figure 7:
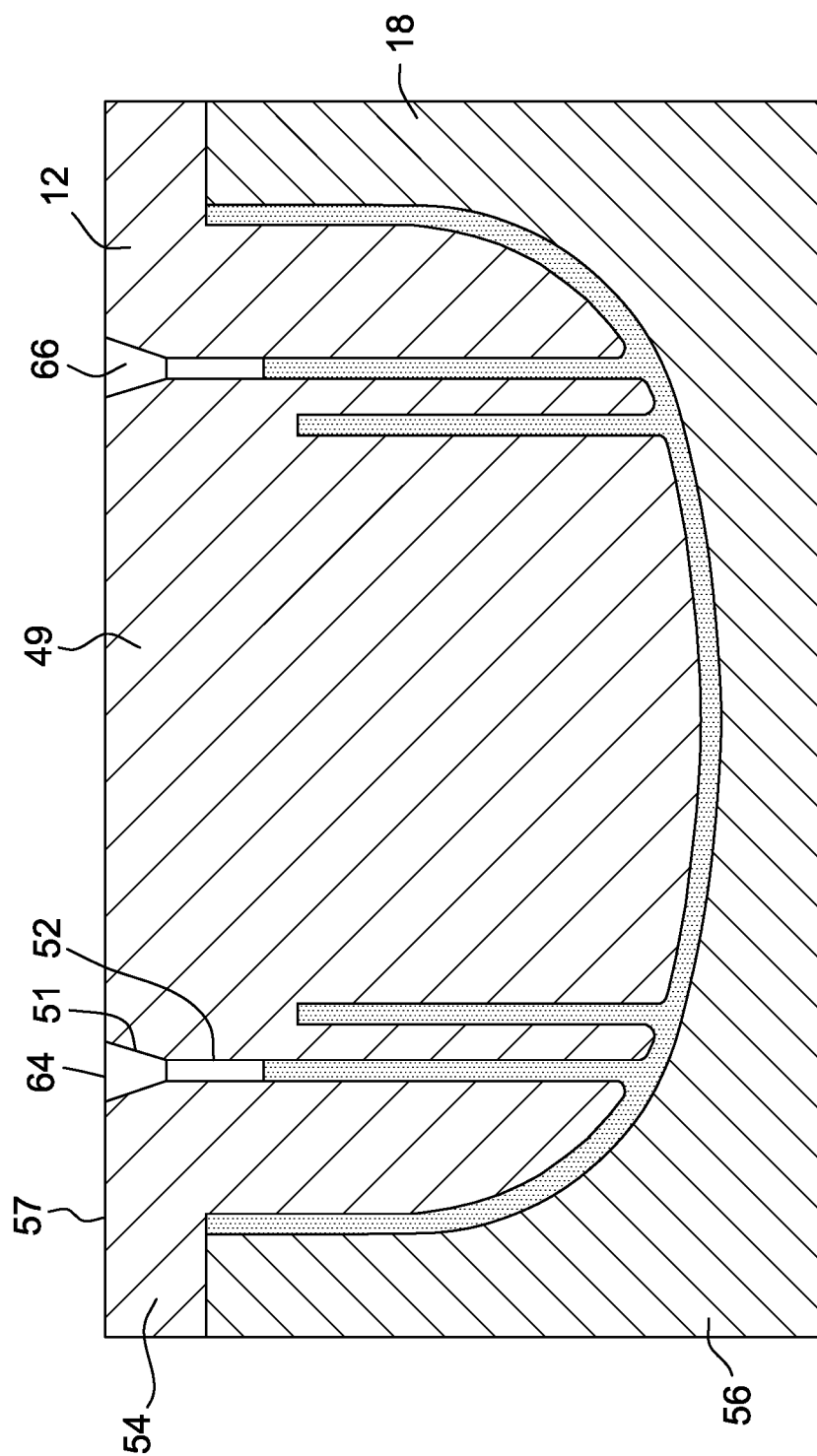
FIG. 7 is a cross-section view of the crucible mold having a slip slurry poured therein.
Figure 8:
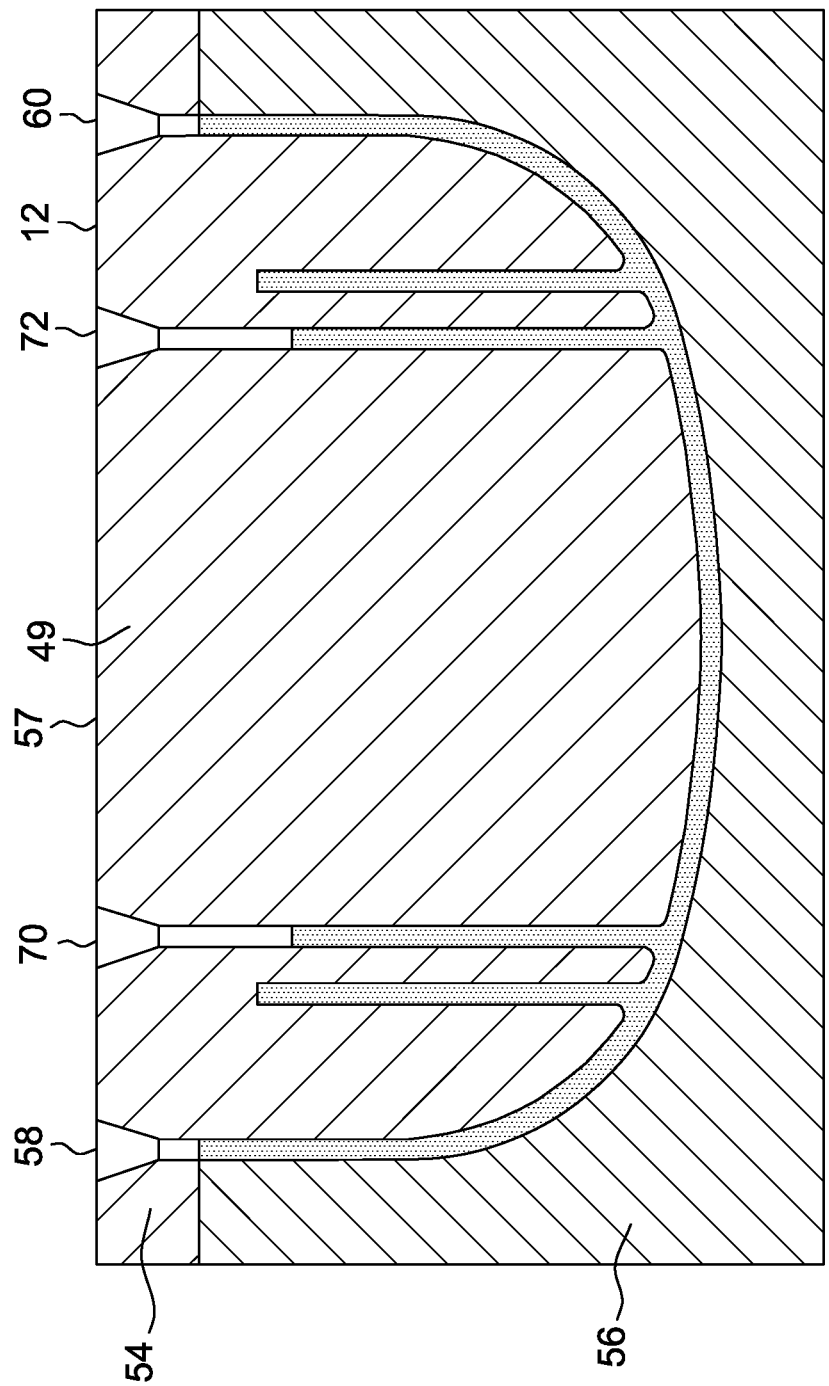
FIG. 8 is another cross-section view of the crucible mold having a slip slurry poured therein.

First and second outer sidewall channel risers 58, 60 (FIG. 2) extend through the upper portion 12 and are in fluid communication with the outer sidewall channel 32. First and second central weir channel risers 64, 66 also extend through the upper portion 12 and are in fluid communication with the central weir channel 34. First and second inner weir channel risers 70, 72 also extend through the upper portion 12 and are in fluid communication with the inner weir channel 36. The risers 58, 60, 64, 66, 70, 72 extend through the upper portion 12 to allow the channel network 20 to be filled with the slip slurry. For example, the slip slurry may be added to either the first and second sidewall riser 58, 60 to fill the outer sidewall channel 32 and the bottom channel 30 with slurry. As the channels 30, 32 fill with slurry, air escapes through the corresponding riser 58, 60 that is not being filled with slip slurry. Similarly, slip slurry may be added to either the first or second central weir channel risers 64, 66 and to the first or second inner weir channel risers 70, 72 until the channel network 20 is filled with slip slurry (FIGS. 7-8). In the illustrated embodiment, each riser 58, 60, 64, 66, 70, 72 includes a cone portion 51 (FIG. 5) that opens to the surface 57 of the upper portion 12 of the mold 8 to facilitate pouring the slip slurry into the riser. A duct 52 below the cone portion 51 fluidly connects the cone portion 51 to the respective channel. The slip slurry may be added until the ducts 52 and/or cone portion 51 begins to fill to ensure that the channel network 20 is filled with slip slurry. For example, as the liquid carrier is drawn into the mold 8, the volume of the slip slurry shrinks. Slip slurry disposed within the ducts 52 and/or cone portion 51 of one or more of the risers 58, 60, 64, 66, 70, 72 may be drawn into the channel network 20 as the slip slurry shrinks.

The channels may generally be filled in any order that allows the channel network 20 to fill with slip slurry before parts of the slurry begin to solidify as a green body to allow the resulting crucible to be unitized. The arrangement of risers 58, 60, 64, 66, 70, 72 is exemplary and other arrangements may be used unless stated otherwise. The risers 58, 60, 64, 66, 70, 72 may be openings and/or chambers formed in the upper portion 12 of the mold 8. In some embodiments, the risers 58, 60, 64, 66, 70, 72 include openings/chambers and a liner that is disposed on the surface of the openings/chambers.

In some embodiments, the slip slurry that is added to the channel network 20 to fill the bottom channel 30, outer sidewall channel 32, central weir channel 34 and inner weir channel 36 includes silica and a liquid carrier such as water. The slip slurry may also include other reagents such as suspending agents that keep the silica particles in suspension including any of the suspending agents known to those of skill in the art. Example suspending agents include polymers or organics that absorb onto the particles (e.g., long-chain organic molecules or other agents that allow a surface charge to build-up on the silica particles to reduce particle to particle contact). The slip slurry may also include one or more binding agents that may optionally burn off during sintering as described below. Optionally the slip slurry may include one or more release agents to promote separation of the crucible mold 8 from the resulting green body 40.

The crucible mold 8 may be made of materials that allow the liquid carrier to be removed from the channel network 20 (e.g., such as by capillary action) to form the green body 40. In some embodiments, the crucible mold 8 is made of a plaster such as gypsum plaster (e.g., $CaSO_4 \cdot nH_2O$ which may also be referred to as plaster of Paris). in other embodiments, the crucible mold 8 is made of porous silica. The crucible mold 8 may be a generally porous body that draws the liquid carrier into the mold 8 by capillary action. In other embodiments, the liquid carrier may be drawn out by vacuum.

Once the liquid carrier is drawn out of the slip slurry and into the mold 8, a "green body" 40 (FIGS. 2-3) remains in the mold 8. For example, the green body 40 may have sufficient structure to maintain its shape when separated from the mold. For example, the moisture content of the green body may be less than about 50%, less than about 45%, at least about 30 wt %, at least about 35 wt %, at least about 40 wt %, at least about 45 wt %, from about 30 wt % to about 50 wt % or from about 35 wt % to about 45 wt %.

The green body 40 may be further dried such as by exposing the green body 40 to a relatively low and/or controlled humidity ambient (e.g., after the green body 40 has sufficient strength, the mold 8 is removed and the green body 40 is exposed to the relatively low and/or controlled humidity ambient). The term "green body" or "green state" as used herein should not be considered in a limiting sense and generally refers to an intermediate state of the crucible after the liquid carrier has been partially drawn from the slip slurry and before sintering of the structure.

Figure 9:
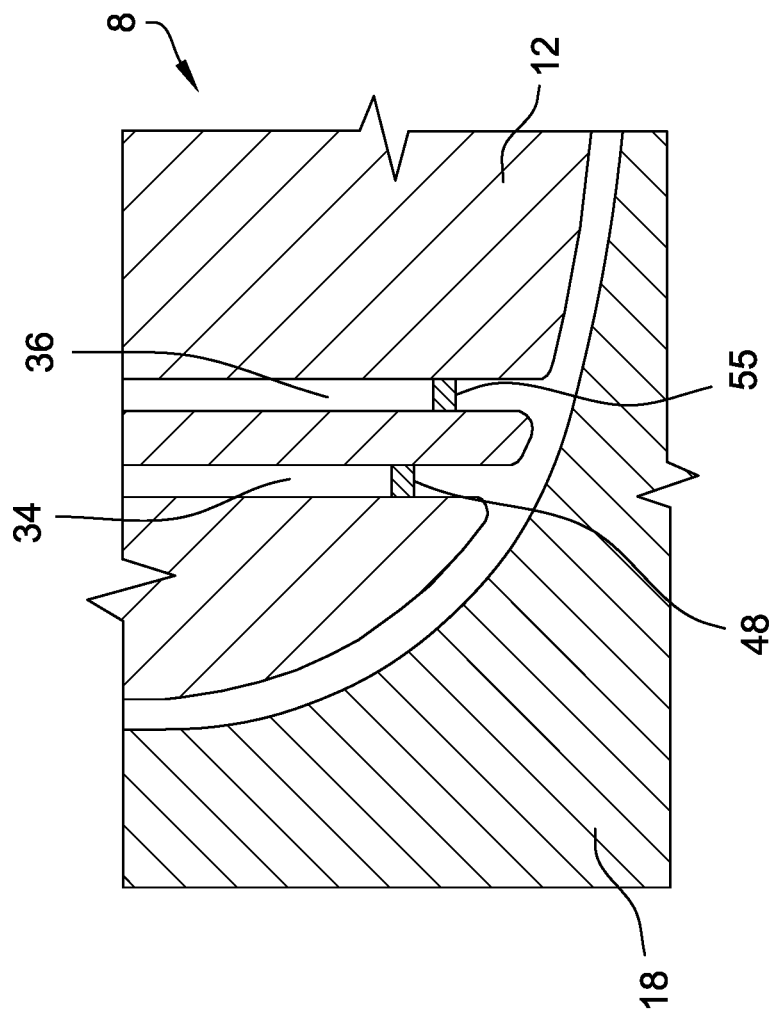
FIG. 9 is a detailed cross-section view of the crucible mold showing a central weir peg and an inner weir peg for forming openings in a central weir and an inner weir of the resulting crucible.

To separate the mold 8 from the green body 40, the upper portion 12 of the mold 8 may be lifted from the green body 40 and from the lower portion 18. The green body 40 may then be lifted from the lower portion 18. The resulting green body 40 may have projections (not shown) that extend up from the sidewalls and weirs that correspond to the riser locations (e.g., the slip slurry was added to completely fill the channel network 20 such that an additional amount filled in the risers). These projections may be ground or cut from the green body 40 or the resulting crucible assembly 5 (FIG. 1), In some embodiments, the mold 8 may include pegs in one or more of the channels to form openings within the resulting crucible to allow molten silicon to move between the various sections of the crucible. For example and with reference to FIG. 9, the upper portion 12 includes a central weir peg 48 that extends laterally across the central weir channel 34. The slip slurry flows around the central weir peg 48 which creates an opening 38 (FIG. 1) through the central weir 24 of the resulting crucible assembly 5. Alternatively or in addition, the upper portion 12 includes an inner weir peg 55 that extends laterally across the inner weir channel 36 to form an opening 41 (FIG. 1) in the inner weir 31. After the upper portion 12 of the mold 8 is removed from the green body 40 and the lower portion 18, the central weir peg 48 and the inner weir peg 55 may be removed (e.g., drilled or chiseled out). The position of the pegs 48, 55 (and resulting crucible openings 38, 41) is exemplary and other positions (e.g., heights, relative circumferential positions between pegs, and the like). The mold 8 may include additional or other arrangements of pegs to form openings in the central weir 24 and/or inner weir 31. In some embodiments, the mold 8 does not include pegs. For example, the openings between weirs may be formed directly in the green body and/or resulting crucible (e.g., by drilling or chiseling) and/or the crucible assembly 5 is configured such that silicon pours over the weirs.

The crucible mold 8 is exemplary and other embodiments may contain different arrangements of weirs and the like unless stated otherwise (e.g., containing only a single weir (i.e., only an inner weir) or more than two weirs). In some embodiments, the crucible mold 8 may be re-used in additional cycles for forming a crucible assembly 5 (e.g., used in two, three, four, five or ten or more cycles). The mold 8 may be dried between cycles such as by placing the mold in a drying oven to evaporate the liquid that was pulled therein during formation of the green body 40.

Once the green body 40 is removed from the mold 8, the green body 40 may be sintered (e.g., in a drying furnace) to dry and densify the green body 40 and to form the unitized crucible assembly 5 (FIG. 1). The green body 40 may be sintered at a temperature from about 1200° C. to about 1800° C., from about 1300° C. to about 1700° C., or from about 1300° C. to about 1650° C. In some embodiments, the crucible assembly 5 has a moisture content of less than 20 wt %, less than 15 wt % or less than 10 wt % after sintering.

The unitized crucible assembly 5 after sintering is shown in FIG. 1. In various embodiments of the present disclosure, the unitized crucible assembly 5 does not include seams at the joint 13 formed between the bottom 17 and the central weir 24 and the joint 15 formed at the bottom 17 and the inner weir 31 (i.e., without voids at these joints 13, 15). Alternatively or in addition, the unitized crucible assembly 5 does not include tacking at the joints 13, 15. Such tacking may be used in conventional crucible assemblies to connect the weirs 24, 31 at the crucible bottom 17. In the illustrated embodiment, the unitized crucible assembly 5 includes a single layer bottom 17 (i.e., the crucible assembly 5 does not include stacked crucibles each having its own bottom). The unitized crucible assembly 5 may be transparent.

In some embodiments, the slip slurry is selected such that the resulting crucible assembly has a desired purity threshold. For example and in accordance with some embodiments, the crucible assembly 5 includes calcium in a concentration less than about 1 ppmw, less than about 0.8 ppmw or less than about 0.7 ppmw. Alternatively or in addition, the crucible assembly 5 may include sodium at a concentration of less than about 0.5 ppmw, less than about 0.2 ppmw or less than about 0.1 ppmw. Alternatively or in addition, the crucible assembly 5 may include potassium at a concentration of less than about 0.5 ppmw, less than about 0.2 ppmw or less than about 0.1 ppmw. Alternatively or in addition, the crucible assembly 5 may include lithium at a concentration of less than about 0.5 ppmw, less than about 0.4 ppmw or less than 0.3 ppmw. Alternatively or in addition, the crucible assembly 5 may include iron at a concentration of less than about 0.5 ppmw, less than about 0.3 ppmw or less than about 0.15 ppmw.

In some embodiments, the mold 8 is selected (and/or processed) to achieve one or more of the purity amounts listed above. For example, the mold may be made of porous silica to reduce calcium content of the resulting crucible (e.g., relative to gypsum plaster molds).

The unitized crucible assembly 5 shown and described herein is an example assembly. The assembly 5 may have other dimensions (e.g., a shallower or deeper melt in one or more melt zones), purities, features and/or arrangements unless stated otherwise.

The methods of the present disclosure for forming a unitized crucible may be used to produce a single crystal silicon ingot. In such methods, a unitized crucible produced by an embodiment of the methods of the present disclosure is provided. In some embodiments, the unitized crucible assembly 5 includes a crucible melt zone 22 disposed between the outer sidewall 10 and the central weir 24. The unitized crucible assembly 5 also contains a stabilization zone 26 disposed between the central weir 24 and the inner weir 31. The unitized crucible assembly 5 also contains a growth zone 28 disposed within the inner weir 31.

Polycrystalline silicon is added to the crucible melt zone 22 where the silicon melts and replenishes the silicon melt. Silicon melt flows through the central weir opening 38 and into the stabilization zone 26. The silicon melt then flows through the inner weir opening 41 to the growth zone 28 disposed within the inner weir 31. The silicon melt within the growth zone 28 is contacted with a single seed crystal and the seed crystal is withdrawn from the silicon melt to form a single crystal silicon ingot. The various silicon melt zones (e.g., melt zone 22, stabilization zone 26 and growth zone 28) allow the ingot to be grown in accordance with continuous Czochralski methods in which polycrystalline silicon is continuously or semi-continuously added to the melt while an ingot is continuously pulled from the growth zone 28.

Compared to conventional crucible assemblies for holding a silicon melt, the crucible assemblies and methods for producing such crucible assemblies of the present disclosure have several advantages. By producing a unitized (e.g., one-piece construction) crucible having a central weir and an inner weir, the crucible assembly allows for continuous ingot growth (continuous Czochralski) while allowing for the advantages of a unitized crucible. By unitizing the crucible bottom, sidewalls and weirs, the crucible assembly is better able to hold tolerances (e.g., height of sidewall and weirs, wall thickness, melt flow path, and the like). This allows the crucible assembly to more easily fit-up into the ingot puller system which may reduce or eliminate use of alignment tools (i.e., tools to fit the various parts of a non-unitized crucible together within the ingot puller system). The unitized crucible may undulate less which allows it to better fit into the susceptor of the ingot puller apparatus.

The unitized crucible also enables more wall thickness control for improved thermal response, allows for more flexibility for doped chemistries, and reduces or eliminates pre-bond cycles (i.e., heating cycles used to connect a weir to the crucible bottom) which consume ingot puller assembly run times. Unitized crucible assemblies also involve less processing and supply logistics compared to crucible assemblies formed from multiple parts. In embodiments in which the crucible mold includes pegs that extend across the channels for forming weirs in the crucible, the resulting crucible has pre-formed openings which allow silicon melt to move to various melt zones within the resulting crucible during ingot growth.

In some embodiments, the slip and/or mold are selected such that the resulting crucible has a relatively low impurity content (e.g., less than about 1 ppmw calcium, less than about 0.5 ppmw sodium, less than about 0.5 ppmw potassium, less than 0.5 ppmw lithium, and/or less than 0.5 ppmw iron) to reduce likelihood of loss of zero dislocation during ingot growth. In embodiments in which the mold is made of porous silica, the crucible assembly may be more pure due to the lower calcium content of the porous silica relative to components cast from molds made of gypsum plaster.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for forming a unitized crucible assembly for holding a melt of silicon for forming a silicon ingot by the Czochralski method, the method comprising:
    providing a crucible mold, the crucible mold having:
        a channel network comprising:
            a bottom channel;
            an outer sidewall channel that extends from the bottom channel;
            a central weir channel that extends from the bottom channel; and
            an inner weir channel that extends from the bottom channel, the central weir channel being disposed between the outer sidewall channel and the inner weir channel, the outer sidewall channel, the central weir channel, and the inner weir channel being interconnected;
        a central weir channel riser that is in fluid communication with the central weir channel;

an inner weir channel riser that is in fluid communication with the inner weir channel; and an outer sidewall channel riser that is in fluid communication with the outer sidewall channel, wherein the central weir channel riser, the inner weir channel riser, and the outer sidewall channel riser extend through an upper surface of the crucible mold;

introducing a slip slurry into at least one of (1) the central weir channel riser, (2) the inner weir channel riser, and (3) the outer sidewall channel riser to fill the bottom channel, outer sidewall channel, central weir channel, and inner weir channel with the slip slurry, the slip slurry comprising silica and a liquid carrier;

removing at least a portion of the liquid carrier from the channel network to form a green body;

separating the green body from the crucible mold; and sintering the green body to dry and densify the green body to form the unitized crucible assembly.

2. The method as set forth in claim 1 wherein the crucible mold comprises a porous body and draws the liquid carrier into the crucible mold by capillary action.

3. The method as set forth in claim 2 wherein the porous body is made of porous silica.

4. The method as set forth in claim 1 wherein a moisture content of the green body is less than about 50 wt %.

5. The method as set forth in claim 1 wherein the green body is sintered at a temperature from about 1200° C. to about 1800° C.

6. The method as set forth in claim 1 wherein the bottom channel, outer sidewall channel, central weir channel and inner weir channel are each fluidly connected to each other.

7. The method as set forth in claim 6 wherein the bottom channel is rounded and the unitized crucible assembly is transparent and includes a single layer bottom.

8. The method as set forth in claim 1 wherein the unitized crucible assembly comprises:
a bottom;
an outer sidewall that extends upward from the bottom;
a central weir that extends upward from the bottom; and
an inner weir that extends upward from the bottom, the central weir being disposed between the outer sidewall and the inner weir.

9. The method as set forth in claim 1 wherein the slip slurry and/or crucible mold are selected to form a unitized crucible assembly having a concentration of calcium of less than about 1 ppmw, a concentration of sodium of less than about 0.5 ppmw, a concentration of potassium of less than about 0.5 ppmw, a concentration of lithium of less than about 0.5 ppmw, and a concentration of iron of less than about 0.5 ppmw.

10. The method as set forth in claim 1 wherein each of the central weir channel riser, inner weir channel riser, and outer sidewall channel riser comprises a cone portion and a duct, the cone portion being disposed above the duct and in fluid communication with the duct.

11. The method as set forth in claim 1 wherein the central weir channel riser is a first central weir channel riser, the inner weir channel riser is a first inner weir channel riser, and the outer sidewall channel riser is a first outer sidewall channel riser, the crucible mold comprising:
a second central weir channel riser that is in fluid communication with the central weir channel;
a second inner weir channel riser that is in fluid communication with the inner weir channel; and
a second outer sidewall channel riser that is in fluid communication with the outer sidewall channel riser,
the method comprising withdrawing air from at least one of (1) the second central weir channel riser, (2) the second inner weir channel riser, and (3) the second outer sidewall channel riser while slip slurry is introduced into at least one of (1) the central weir channel riser, (2) the inner weir channel riser, and (3) the outer sidewall channel riser.

12. The method as set forth in claim 1 wherein the central weir channel riser, the inner weir channel riser, and the outer sidewall channel riser are aligned.

\* \* \* \* \*